(12) United States Patent
Yamamuro

(10) Patent No.: US 10,040,205 B2
(45) Date of Patent: Aug. 7, 2018

(54) SUCTION NOZZLE

(71) Applicant: FUJI MACHINE MFG. CO., LTD., Chiryu-shi (JP)

(72) Inventor: Junichi Yamamuro, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 0 days.

(21) Appl. No.: 15/511,724

(22) PCT Filed: Oct. 10, 2014

(86) PCT No.: PCT/JP2014/077161
§ 371 (c)(1),
(2) Date: Mar. 16, 2017

(87) PCT Pub. No.: WO2016/056115
PCT Pub. Date: Apr. 14, 2016

(65) Prior Publication Data
US 2017/0291308 A1    Oct. 12, 2017

(51) Int. Cl.
*B25J 15/06* (2006.01)

(52) U.S. Cl.
CPC ....... *B25J 15/0691* (2013.01); *B25J 15/0666* (2013.01)

(58) Field of Classification Search
CPC .. B25J 15/0616; B25J 15/0641; B25J 15/065; B25J 15/0658; B25J 15/0666; B25J 15/0683; B25J 15/0691; Y10S 901/40
(Continued)

(56) References Cited

U.S. PATENT DOCUMENTS 4,650,233 A * 3/1987 Mang ..................... B65G 47/91
248/363
4,850,780 A * 7/1989 Safabakhsh ....... H01L 21/67132
156/765

(Continued)

FOREIGN PATENT DOCUMENTS

JP        48-25373 U      3/1973
JP        58-98191 U      7/1983
(Continued)

OTHER PUBLICATIONS

International Search Report dated Jan. 6, 2015, in PCT/JP2014/077161, filed Oct. 10, 2014.
(Continued)

*Primary Examiner* — Dean J Kramer
(74) *Attorney, Agent, or Firm* — Oblon, McClelland, Maier & Neustadt, L.L.P.

(57) ABSTRACT

In a suction nozzle which sucks and holds a component on a suction surface by using negative pressure air and detaches the sucked and held component from the suction surface by using positive pressure air, the positive pressure air and the negative pressure air used when the component is held and detached selectively flow through an air flow path. In addition, a rod is advanced and retracted toward the suction surface in an inside section of the suction nozzle. The rod protrudes from the suction surface by the positive pressure air flowing through the air flow path and is retracted to the inside section of the suction nozzle when the negative pressure flows through the air flow path.

5 Claims, 5 Drawing Sheets

(58) Field of Classification Search
USPC .......................................... 294/183, 186, 187
See application file for complete search history.

(56) References Cited

U.S. PATENT DOCUMENTS

| | | | | |
|---|---|---|---|---|
| 4,858,976 | A * | 8/1989 | Stoll | ................... B25B 11/005 294/186 |
| 5,183,670 | A | 2/1993 | Trudeau | |
| 6,065,789 | A * | 5/2000 | Nagai | ................... B41F 21/06 294/185 |
| 7,878,564 | B2 * | 2/2011 | Kang | ................ H01L 21/6838 294/186 |
| 2002/0074379 | A1 | 6/2002 | Kim | |
| 2007/0228752 | A1 * | 10/2007 | Liou | .................... B60R 11/02 294/187 |
| 2008/0179905 | A1 * | 7/2008 | Park | .................... A47K 17/022 294/187 |
| 2012/0193500 | A1 * | 8/2012 | Kniss | ................... B25B 11/007 248/363 |
| 2014/0225391 | A1 * | 8/2014 | Kuolt | ................... B25J 15/0616 294/183 |

FOREIGN PATENT DOCUMENTS

| | | |
|---|---|---|
| JP | 11-45930 A | 2/1999 |
| JP | 2001-25988 A | 1/2001 |
| JP | 2002-313883 A | 10/2002 |
| JP | 2010-99733 A | 5/2010 |
| JP | 5610658 B1 | 10/2014 |
| WO | WO 2006/001564 A1 | 1/2006 |

OTHER PUBLICATIONS

Extended European Search Report dated Sep. 13, 2017 in Patent Application No. 14903588.3.

\* cited by examiner

SUCTION NOZZLE

TECHNICAL FIELD

The present application relates to a suction nozzle which sucks and holds a component on a suction surface by using negative pressure air and detaches the sucked and held component from the suction surface by using positive pressure air.

BACKGROUND ART

Normally, a suction nozzle can perform mounting work of a component on a circuit substrate by sucking and holding a component by a negative pressure and detaching the component by a positive pressure. The component includes a high adhesive component, for example, made of rubber material or the like and in a case where the high adhesive component is sucked and held by the suction nozzle, there is a case where the high adhesive component is stuck to the suction nozzle and thus is unlikely to be detached from the suction nozzle. In addition, even in a component other than the high adhesive component, there is a case where the component is stuck to the suction nozzle by static electricity or the like and thus is unlikely to be detached from the suction nozzle. In the related art, PTL 1 discloses a suction nozzle in which a pusher moving in an up-down direction is installed on a side thereof and by which the sucked and held component is forcibly detached by the pusher.

PTL 1: JP-A-2001-25988

SUMMARY

According to the suction nozzle described in PTL 1, a component can be reliably detached from the suction nozzle. However, in the suction nozzle described in PTL 1, there is a concern that the entirety of the device becomes large and complicated since a mechanism which moves the pusher and a mechanism which sucks and holds the component by the suction nozzle are individually installed. Accordingly, there is a lot of room for improvement in the suction nozzle which can reliably detach the component, and practicality can be improved by performing various improvements. The disclosure has been made in view of such circumstances, and an object of the present disclosure is to provide a suction nozzle having high practicality.

In order to solve the problem described above, in the disclosure, a suction nozzle which sucks and holds a component on a suction surface by using negative pressure air and detaches the sucked and held component from the suction surface by using positive pressure air includes an air flow path through which the positive pressure air and the negative pressure air selectively flow; and a movable member which is held to be capable of being advanced and retracted toward the suction surface in an inside section of the suction nozzle. The movable member protrudes from the suction surface by the positive pressure air flowing through the air flow path and is retracted to the inside section of the suction nozzle when the negative pressure air flows through the air flow path.

Advantageous Effects

In the suction nozzle described in the disclosure, the positive pressure air and the negative pressure air used when the component is held and detached selectively flow through the air flow path. In addition, the movable member is held in the inside section of the suction nozzle so as to be capable of being advanced and retracted toward the suction surface. The movable member protrudes from the suction surface by positive pressure air flowing through the air flow path, and is retracted to the inside section of the suction nozzle when negative pressure air flows through the air flow path. In other words, in the suction nozzle described in the disclosure, the air flow path is shared as a mechanism which moves the movable member and a mechanism which sucks and holds the component by the suction nozzle. Accordingly, it is possible to make the device compact, simple or the like and to improve practicality of the suction nozzle.

DESCRIPTION OF EMBODIMENTS

Hereinafter, an embodiment of the disclosure will be described in detail with reference to the drawings as an aspect for carrying out the disclosure.

Configuration of Component Mounting Apparatus

Figure 1:
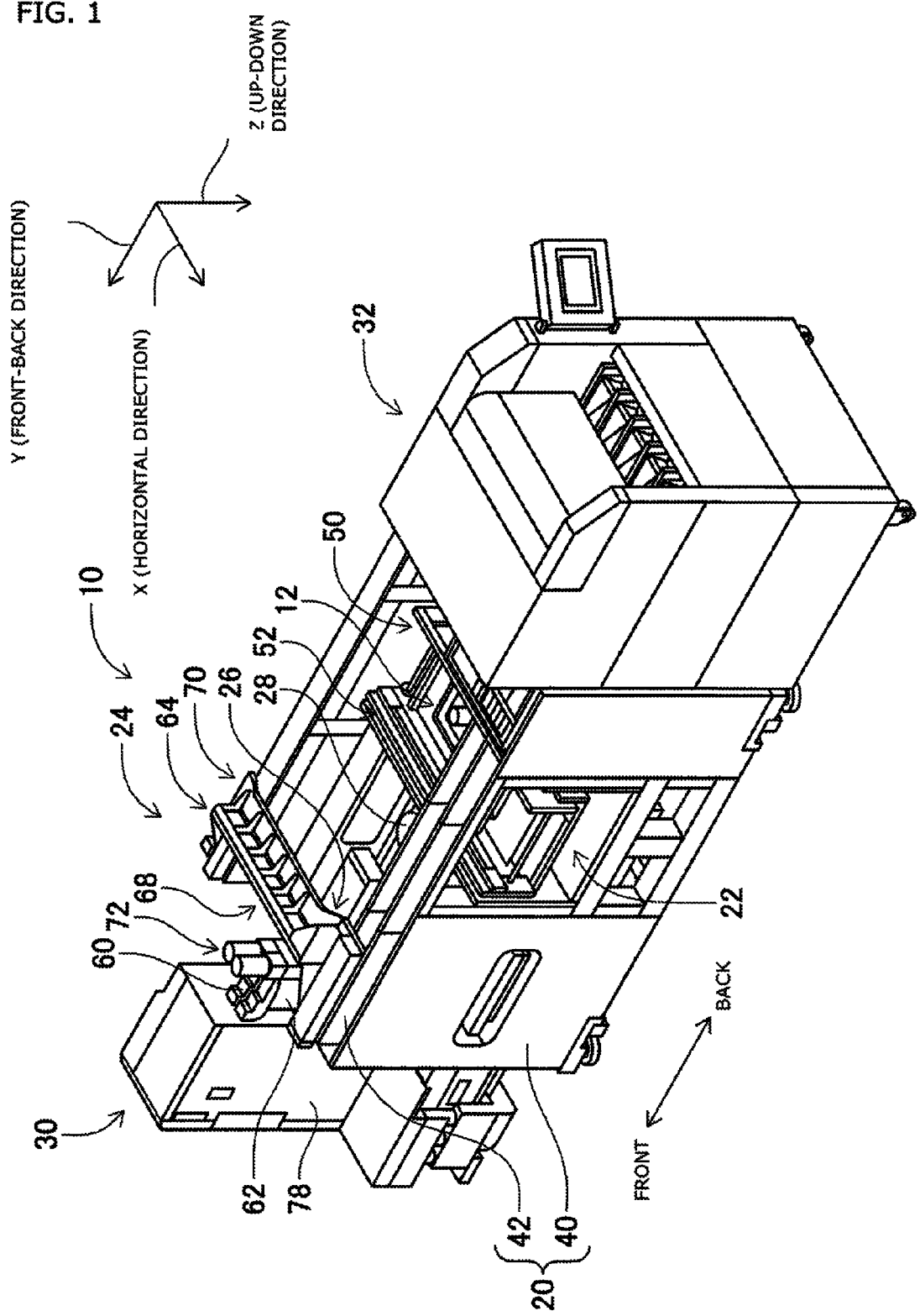
FIG. 1 is a perspective view illustrating a component mounting apparatus.

FIG. 1 illustrates a component mounting apparatus 10. The component mounting apparatus 10 is an apparatus which performs mounting work of a component on a circuit substrate 12. The component mounting apparatus 10 includes an apparatus main body 20, a substrate conveyance and holding device 22, a component mounting device 24, imaging devices 26 and 28, a component supply device 30, and a bulk component supply device 32. An example of circuit substrate 12 includes a circuit board, a substrate having a three-dimensional structure, or the like, and an example of a circuit board includes a printed-wiring board, a printed-circuit board, or the like.

The apparatus main body 20 is configured by a frame section 40 and a beam section 42 which is suspended over the frame section 40. The substrate conveyance and holding device 22 is installed in a center in a front-back direction of the frame section 40, and includes a conveyance device 50 and a clamping device 52. The conveyance device 50 is a device which conveys the circuit substrate 12, and the clamping device 52 is a device which holds the circuit substrate 12. Accordingly, the substrate conveyance and holding device 22 conveys the circuit substrate 12 and fixedly holds the circuit substrate 12 at a predetermined position. In the following description, a conveyance direction of the circuit substrate 12 is referred to as an X-direction, a horizontal direction perpendicular to the direction thereof is referred to as an Y-direction, and a vertical direction is referred to as a Z-direction. In other words, a width direction of the component mounting apparatus 10 is the X-direction, and the front-back direction thereof is the Y-direction.

Figure 2:
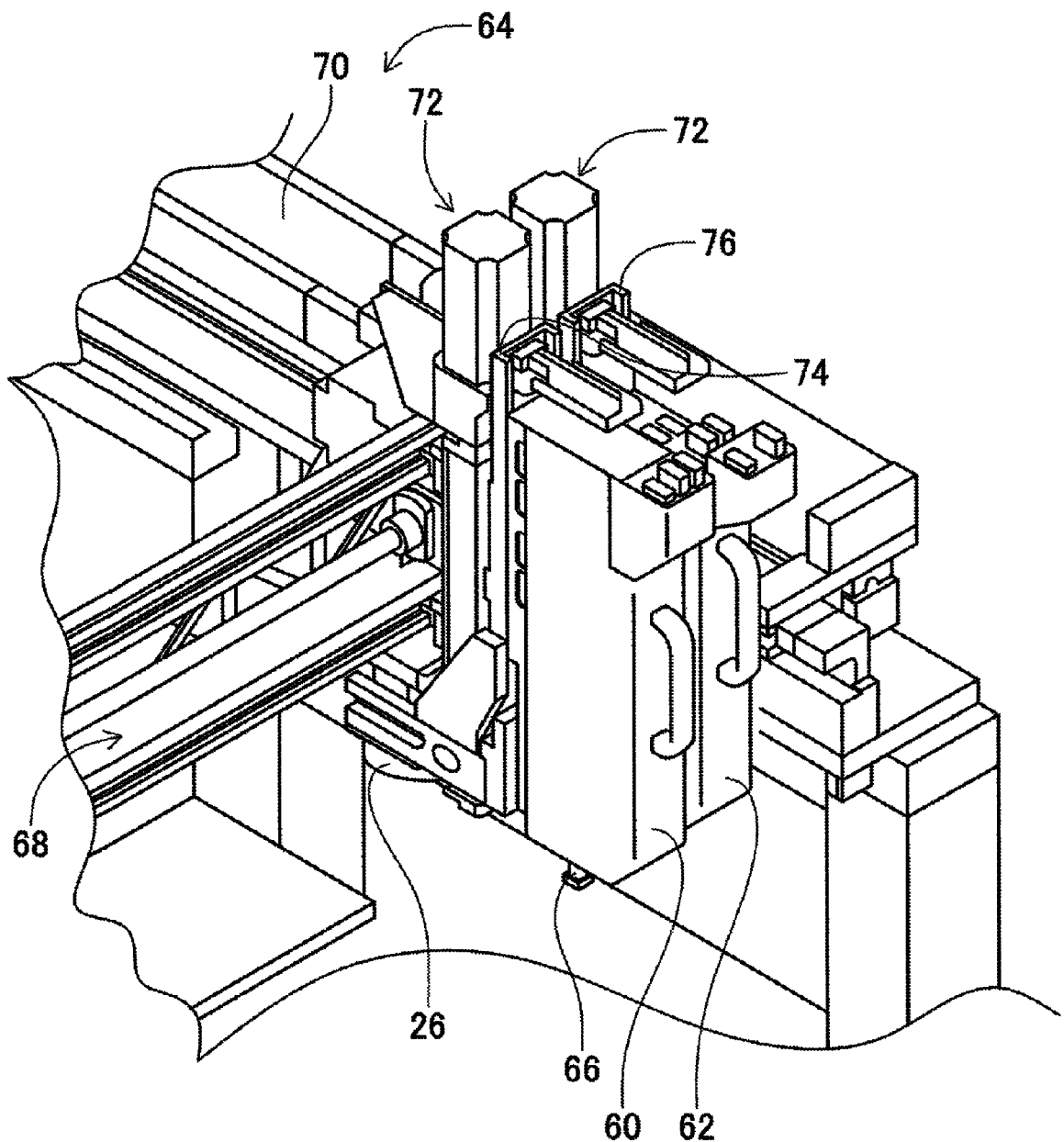
FIG. 2 is a perspective view illustrating a component mounting device of the component mounting apparatus.

The component mounting device 24 is installed in the beam section 42, and includes two work heads 60 and 62 and a work head moving device 64. A suction nozzle (see FIG. 2) 66 is provided on a lower end face of each of the work heads 60 and 62 to be attachable to and detachable from the lower end face thereof. The suction nozzle 66 communicates with a positive and negative pressure supply device (not illustrated) via an air flow path. The suction nozzle 66 sucks and holds the component by the negative pressure, and detaches the held component by the positive pressure. In addition, the work head moving device 64 includes an X-direction moving device 68, a Y-direction moving device 70, and a Z-direction moving device 72. By the X-direction movement device 68 and the Y-direction moving device 70, the two work heads 60 and 62 are integrally moved to an arbitrary position on the frame section 40. In addition, as illustrated in FIG. 2, each of the work heads 60 and 62 is mounted to be attachable to and detachable from sliders 74 and 76, and the Z-direction moving device 72 individually moves the sliders 74 and 76 in the up-down direction. In other words, the work heads 60 and 62 are individually moved in the up-down direction by the Z-direction moving device 72.

The imaging device 26 is attached to the slider 74 in a state of facing downward, and is moved along with the work head 60 in the X-direction, the Y-direction, and the Z-direction. Accordingly, the imaging device 26 images the arbitrary position on the frame section 40. As illustrated in FIG. 1, the imaging device 28 is installed between the substrate conveyance and holding device 22 on the frame section 40 and the component supply device 30 in a state of facing upward. Accordingly, the imaging device 28 images the component held by the suction nozzles 66 of the work heads 60 and 62.

The component supply device 30 is installed at an end section of a side of the frame section 40 in the front-back direction. The component supply device 30 includes a tray-type component supply device 78 and a feeder-type component supply device (not illustrated). The tray-type component supply device 78 is a device for supplying a component which is in a state of being placed on a tray. The feeder-type component supply device is a device for supplying a component by a tape feeder (not illustrated).

The bulk component supply device 32 is installed at an end section of the other side of the frame section 40 in the front-back direction. The bulk component supply device 32 is a device which aligns multiple components which are in a state of being scattered separately and supplies the components which are in an aligned state. In other words, the bulk component supply device is a device which aligns the multiple components which are in arbitrary postures in a predetermined posture and supplies the components which are in the predetermined posture. Examples of components supplied by the component supply device 30 and the bulk component supply device 32 include an electronic circuit component, a constituent component of a solar cell, a constituent component of the power module, or the like. In addition, the electronic circuit component includes a component having a lead, a component without a lead, or the like.

Operation of Component Mounting Apparatus

In the component mounting apparatus 10, the mounting work of the component is performed on the circuit substrate 12 held by the substrate conveyance and holding device 22 using the configuration described above. Specifically, the circuit substrate 12 is conveyed to a working position and is fixedly held by the clamping device 52 at the position. Next, the imaging device 26 moves above the circuit substrate 12 to image the circuit substrate 12. Accordingly, information on errors of the holding position of the circuit substrate 12 is obtained. In addition, the component supply device 30 or the bulk component supply device 32 supplies components to a predetermined supply position. Any of the work heads 60 and 62 moves above the supply position of the component and holds the component by using the negative pressure by the suction nozzle 66. Subsequently, the work heads 60 and 62 holding the component move above the imaging device 28, and the imaging device 28 images the component held by the suction nozzles 66. Accordingly, the information on the errors of the holding position of the component is obtained. Subsequently, the work heads 60 and 62 holding the component move above the circuit substrate 12, and correct the error of the holding position of the circuit substrate 12, the error of the holding position of the component, or the like. The component is mounted on the circuit substrate 12 by the suction nozzle 66 detaching the component using the positive pressure.

Structure of Suction Nozzle

As described above, the mounting work is performed by the suction nozzle 66 sucking and holding the component by negative pressure and detaching the component by positive pressure in the component mounting apparatus 10. However, the component mounted on the circuit substrate 12 includes a high adhesive member, for example, a member using rubber materials or the like and in a case where the high adhesive member is held by the suction nozzle 66, there is a case where the member is stuck to the suction nozzle 66 and thus is unlikely to be detached from the suction nozzle 66. In addition, even in a component in which the high adhesive member is not used, there is a case where the component is stuck to the suction nozzle 66 by static electricity or the like and thus is unlikely to be detached from the suction nozzle 66. In view of such circumstances, a member protruding from the suction surface of the suction nozzle 66 when the positive pressure air is supplied to the suction nozzle 66 is provided in the suction nozzle 66, and the component sucked and held to the suction nozzle 66 is forcibly detached from the suction nozzle by this member. Hereinafter, a specific structure of the suction nozzle 66 will be described.

Figure 3:
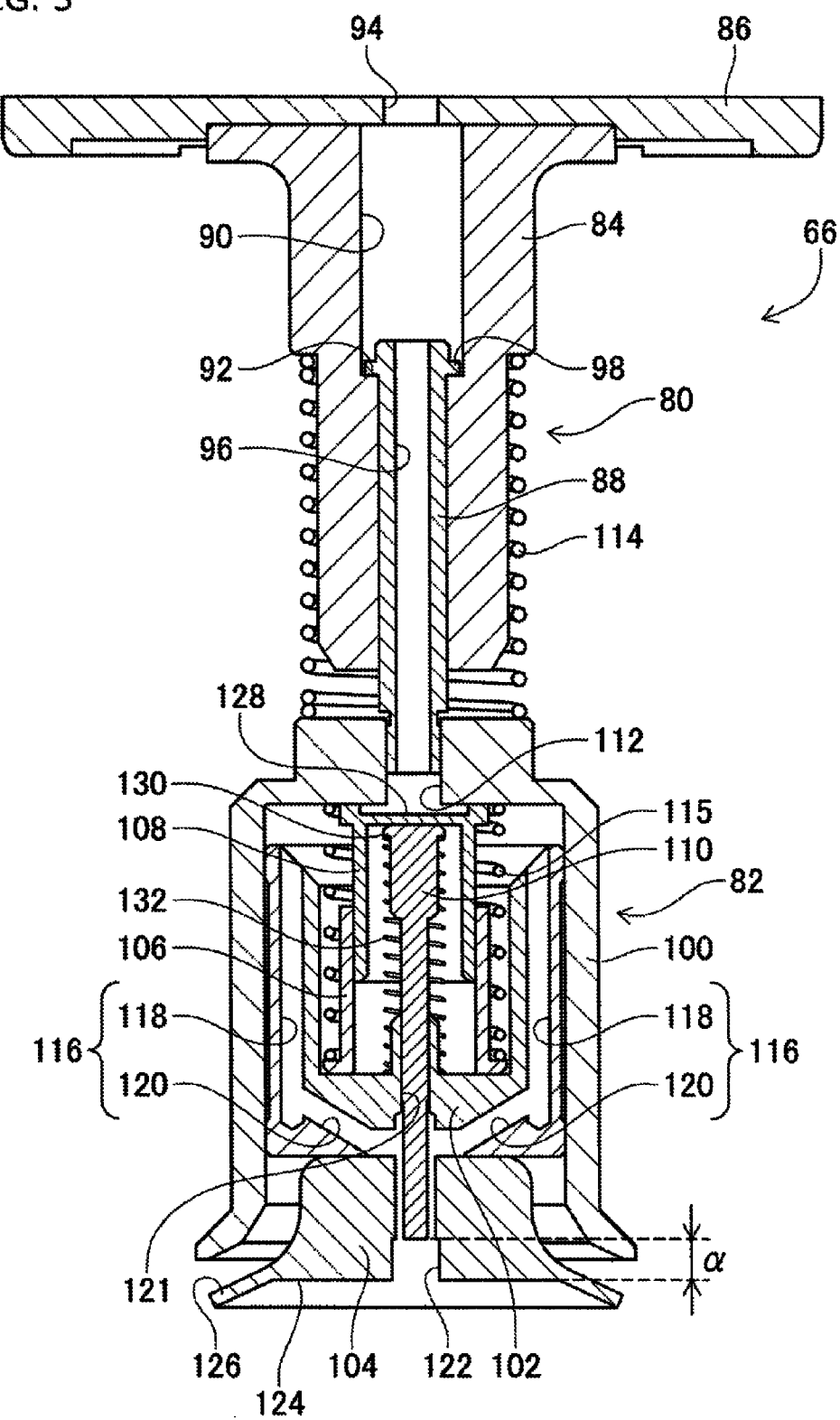
FIG. 3 is a cross-sectional view illustrating a suction nozzle.

As illustrated in FIG. 3, the suction nozzle 66 includes an adapter 80 and a nozzle main body 82. The adapter 80 includes an adapter main body section 84, a flange section 86, and an expansion and contraction section 88. The adapter main body section 84 generally has a cylindrical shape and a through-hole 90 penetrating in the up-down direction is formed in the adapter main body section 84. The through-hole 90 has a stepped shape in which an inner diameter of a portion of an upper side thereof is larger than that of a portion of a lower side thereof, and a stepped surface 92 in a state of facing upward is formed in an inside section of the through-hole 90.

The flange section 86 is fixed to the upper end surface of the adapter main body section 84 so as to extend in a radial direction of the adapter main body section 84, and a through-hole 94 communicating with the through-hole 90 of the adapter main body section 84 is formed on the flange section 86. In addition, the expansion and contraction section 88 generally has a cylindrical shape and a through-hole 96 penetrating in the up-down direction is formed in the expansion and contraction section 88. An outer diameter of the expansion and contraction section 88 is made slightly smaller than the inner diameter of the lower portion than the stepped surface 92 of the through-hole 90, and the expansion and contraction section 88 is inserted into the through-hole 90. In addition, an upper end section of the expansion and contraction section 88 extends to an upper portion than the stepped surface 92 of the through-hole 90 and a lower end section of the expansion and contraction section 88 extends from the lower end section of the adapter main body section 84. Accordingly, by the adapter main body section 84 and the expansion and contraction section 88 moving relative to each other, the extension amount of the expansion and contraction section 88 from the lower end section of the adapter main body section 84 changes, and the adapter 80 expands and contracts. A protruding section 98 protruding in the radial direction is formed on the upper end section of the expansion and contraction section 88. Accordingly, when the expansion and contraction section 88 moves downward, the protruding section 98 engages the stepped surface 92 of the through-hole 90 to prevent the expansion and contraction section 88 from coming off from the through-hole 90.

In addition, the nozzle main body 82 includes a support member 100, a flow path forming member 102, a suction pad 104, a guide member 106, a rod pressing member 108, and a rod 110. The support member 100 generally has a cylindrical shape having a lid, and a through-hole 112 is formed in a center of a lid section thereof. The lower end section of the expansion and contraction section 88 of the adapter 80 is fixedly fitted in the through-hole 112. A coil spring 114 is installed in a compressed state between the support member 100 and the adapter main body section 84 of the adapter 80. Accordingly, the support member 100 is biased downward. In addition, a lower end section of the support member 100 is open in a trumpet shape. In other words, a peripheral wall of a lower end section of the support member 100 spreads outward, as going downward.

The flow path forming member 102 generally has a cylindrical shape having a bottom, and an outer diameter of the flow path forming member 102 is slightly smaller than an inner diameter of the support member 100. The flow path forming member 102 is inserted into an inside section of the support member 100 from a lower side of the support member 100. Accordingly, the flow path forming member 102 slides in the up-down direction in the inside section of the support member 100. In addition, a coil spring 115 is installed in a compressed state between a bottom section of the flow path forming member 102 and the lid section of the support member 100. Accordingly, the flow path forming member 102 is biased downward. A stopper (not illustrated) is provided on an inner peripheral surface of the support member 100, and a downward movement of the flow path forming member 102 is restricted by the stopper. Incidentally, in FIG. 3, the flow path forming member 102 is illustrated in a state where the downward movement is restricted by the stopper.

In addition, a peripheral wall section and a bottom section of the flow path forming member 102 are made thick, and the air flow path 116 is formed in the peripheral wall section and the bottom section thereof. Specifically, multiple first flow paths (two first flow paths are illustrated in the figure) 118 are formed in the peripheral wall section of the flow path forming member 102 so as to extend in the up-down direction. An upper end of a first flow path 118 opens at an upper end of the flow path forming member 102, and a lower end of the first flow path 118 is not opened to the lower end of the flow path forming member 102, and the first flow path extends to the middle of the bottom section of the flow path forming member 102. On the other hand, multiple second flow paths 120 are formed on the bottom section of the flow path forming member 102 corresponding to the multiple first flow paths 118. The second flow path 120 is inclined and communicates with the lower end of the corresponding first flow path 118 at the upper end thereof. The lower end of the second flow path 120 opens to the center section of the bottom face of the flow path forming member 102. The lower ends of the multiple second flow paths 120 are open to the same portion of the bottom face of the flow path forming member 102. Further, a through-hole 121 penetrating in the up-down direction is formed in the center section of the bottom section of the flow path forming member 102, and a lower end of the through-hole 121 is opened to the same position as the lower end of the multiple second flow paths 120. In other words, the lower end of the multiple second flow paths 120 and the lower end of the through-hole 121 are opened to one position of the bottom face of the flow path forming member 102.

The suction pad 104 is formed of an elastically deformable material and generally has a short cylindrical column shape. The suction pad 104 is fixed to the lower end face of the flow path forming member 102, and a through-hole 122 penetrating in the up-down direction is formed in the suction pad 104. The upper end of the through-hole 122 communicates with the lower end of the second flow path 120 of the flow path forming member 102. In addition, a recessed section 124 is formed on the lower end face of the suction pad 104. The recessed section 124 is formed such that an outer edge section 126 of the lower end face of the suction pad 104 is a thin wall over an entire circumference thereof, and the outer edge section 126 spreads outward, as going downward. In other words, the outer edge section 126 is open in a trumpet shape. Although a portion of an upper side of the flow path forming member 102 is positioned in an inside section of the support member 100, the portion of the lower side of the flow path forming member 102, that is, the outer edge section 126 extends from the lower side of the support member 100. In addition, an outer diameter of the lower end of the outer edge section 126 is slightly smaller than the outer diameter of the lower end of the support member 100, and the outer edge section 126 and the lower end of the support member 100 are separated from each other.

The guide member 106 generally has a cylindrical shape, and the outer diameter of the guide member 106 is smaller than the inner diameter of the flow path forming member 102. The guide member 106 is fixed in a state of being erected on the bottom section of the flow path forming member 102.

The rod pressing member 108 generally has a cylindrical shape having a lid, and an outer diameter of the rod pressing member 108 is slightly smaller than the inner diameter of the guide member 106. A portion of a lower side of the rod pressing member 108 is inserted into the inside section of the guide member 106 from an upper side of the guide member 106 and the rod pressing member 108 is slid in the up-down direction at the inside section of the guide member 106 in the inserted section. In addition, a recessed section 128 is formed in an upper end surface of the rod pressing member 108 so as to face the through-hole 112 of the support member 100. The recessed section 128 is formed so as to extend in the radial direction of the rod pressing member 108 and reaches an outer peripheral surface of the rod pressing member 108. In other words, the recessed section 128 opens to the upper end surface and the outer peripheral surface of the rod pressing member 108.

The rod 110 generally has a bar shape, the outer diameter thereof is slightly smaller than the inner diameter of the through-hole 121 of the flow path forming member 102 and is smaller than the inner diameter of the through-hole 122 of the suction pad 104. The rod 110 is accommodated in the inside sections of the guide member 106 and the rod pressing member 108 in the portion of the upper side thereof, is inserted into the through-hole 121 of the flow path forming member 102 at the center section thereof, and extends to the inside section of the through-hole 122 of the suction pad 104 in the portion of the lower side thereof. Accordingly, the rod 110 slides in the through-hole 121 of the flow path forming member 102, and the lower end section of the rod 110 moves in the up-down direction in the inside section of the through-hole 122 of the suction pad 104.

In addition, a flange section 130 is formed on the upper end of the rod 110, and a coil spring 132 is installed in a compressed state between the flange section 130 and the bottom section of the flow path forming member 102. Accordingly, the rod 110 is biased upward. By the rod 110 being biased upward, the upper end of the rod 110 is in contact with the lid section of the rod pressing member 108 and the rod pressing member 108 is also biased along with the rod 110 upward. Therefore, the lid section of the rod pressing member 108 is in contact with the lid section of the support member 100 and covers the through-hole 112. However, in the lid section of the rod pressing member 108, the recessed section 128 which opens to the upper end surface and the outer peripheral surface thereof is formed and thus even if the lid section of the rod pressing member 108 covers the through-hole 112, the through-hole 112 and the inside of the support member 100 communicate with each other via the recessed section 128.

In addition, in a state where downward movement of the flow path forming member 102 is restricted by the stopper and the rod pressing member 108 is in contact with the lid section of the support member 100, the lower end of the rod 110 is positioned a predetermined distance a above the lower end of the through-hole 122 of the suction pad 104. The predetermined distance a is longer than a distance which the flow path forming member 102 is movable in the inside of the support member 100, that is, a distance between the flow path forming member 102 (flow path forming member 102 in FIG. 3) of which downward movement is restricted by the stopper and the flow path forming member 102 (flow path forming member 102 in FIG. 4) which is moved to the uppermost position against an elastic force of the coil spring 115.

In the suction nozzle 66 structured as described above, when the suction pad 104 is pressed against the component (see FIG. 4) 150 to be held, the outer edge section 126 of the suction pad 104 is in contact with the component 150 and elastically deforms. Accordingly, the inside section of the recessed section 124 of the suction pad 104 is sealed. In this state, when negative pressure air is supplied to the through-holes 90, 94, and 96 of the adapter 80, that is, when air is sucked from the through-holes 90, 94, and 96 of the adapter 80, the air in the inside section of the support member 100 is sucked via the through-hole 112 of the support member 100 and the recessed section 128 of the rod pressing member 108. At this time, air is sucked from the air flow path 116 of the flow path forming member 102, the through-hole 122 of the suction pad 104, the inside section of the recessed section 124, and the component is sucked and held on the outer edge section 126 of the suction pad 104.

Figure 4:
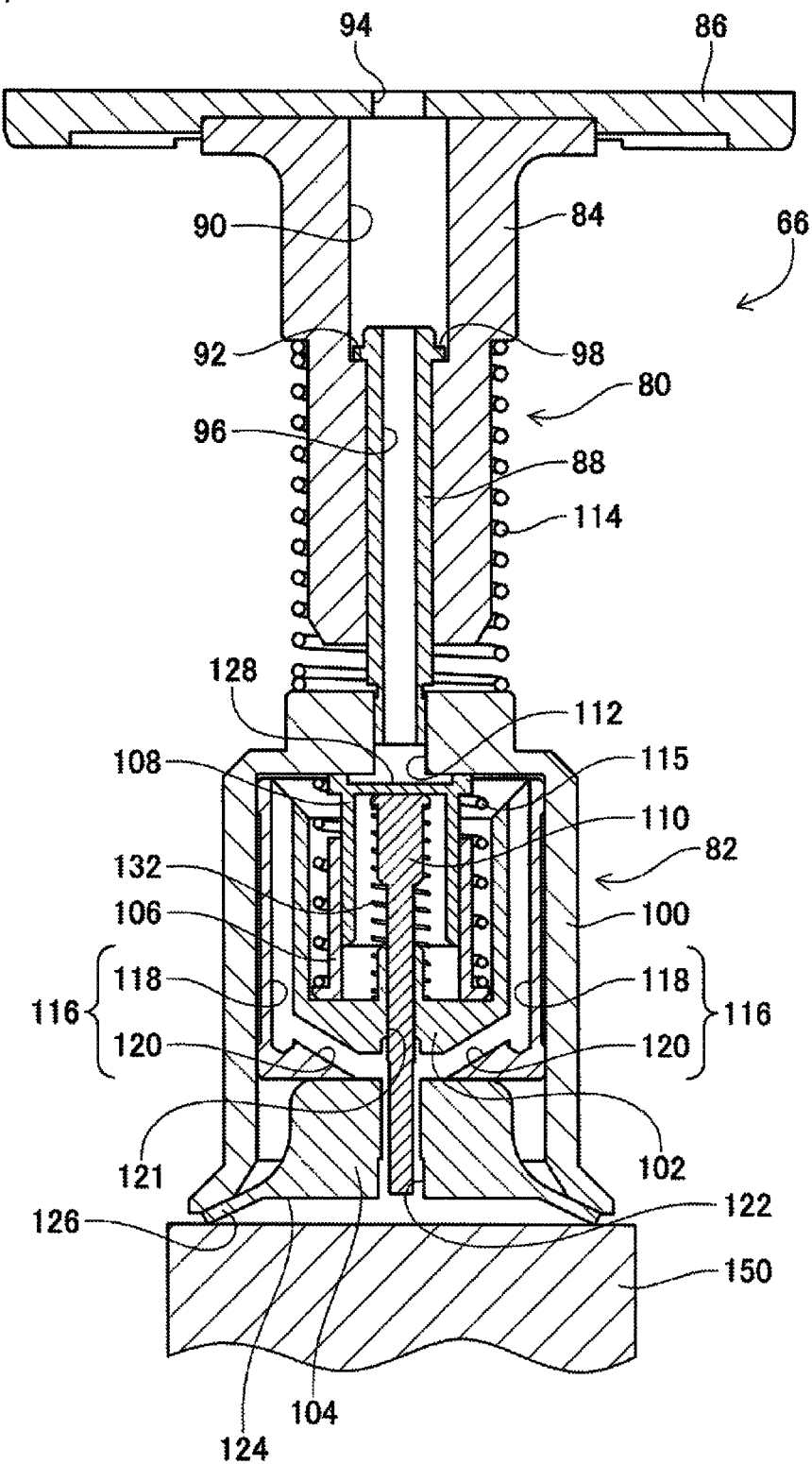
FIG. 4 is a cross-sectional view illustrating the suction nozzle in a state where a component is sucked and held.

Further, when air is sucked from the inside section of the support member 100, as illustrated in FIG. 4, the flow path forming member 102 moves upward against the elastic force of the coil spring 115, and the suction pad 104 also moves upward along with the flow path forming member 102. At this time, the upper surface of the outer edge section 126 of the suction pad 104 is in contact with the lower end of the support member 100, and the outer edge section 126 is supported by the lower end of the support member 100 from the upper face side. Accordingly, because the outer edge section 126 elastically deformed by suction and holding of the component 150 is supported from the upper face side, the elastic deformation of the outer edge section 126 is suppressed and suction and holding of the component 150 is secured by the suction pad 104.

Although the rod 110 relatively moves downward with respect to the flow path forming member 102 and the suction pad 104 according to upward movement of the flow path forming member 102 and the suction pad 104, the lower end of the rod 110 is positioned above the lower end of the opening of the through-hole 122 of the suction pad 104 since the predetermined distance a described above is longer than the movement amount of the flow path forming member 102. Therefore, regardless of the relative downward movement of the rod 110, the suction nozzle 66 sucks and holds the component 150 appropriately.

In addition, in the suction nozzle 66, when the sucked and held component 150 is detached from the suction nozzle 66, supply of negative pressure air to the through-holes 90, 94, and 96 of the adapter 80 is stopped and the positive pressure air is supplied to the through-holes 90, 94, and 96 of the adapter 80. Air is blown into the inside section of the support member 100 via the through-hole 112 of the support member 100 and the recessed section 128 of the rod pressing member 108, by supply of positive pressure air to the through-holes 90, 94, and 96 of the adapter 80. At this time, air is blown into the air flow path 116 of the flow path forming member 102, the through-hole 122 of the suction pad 104 and the inside section of the recessed section 124.

Figure 5:
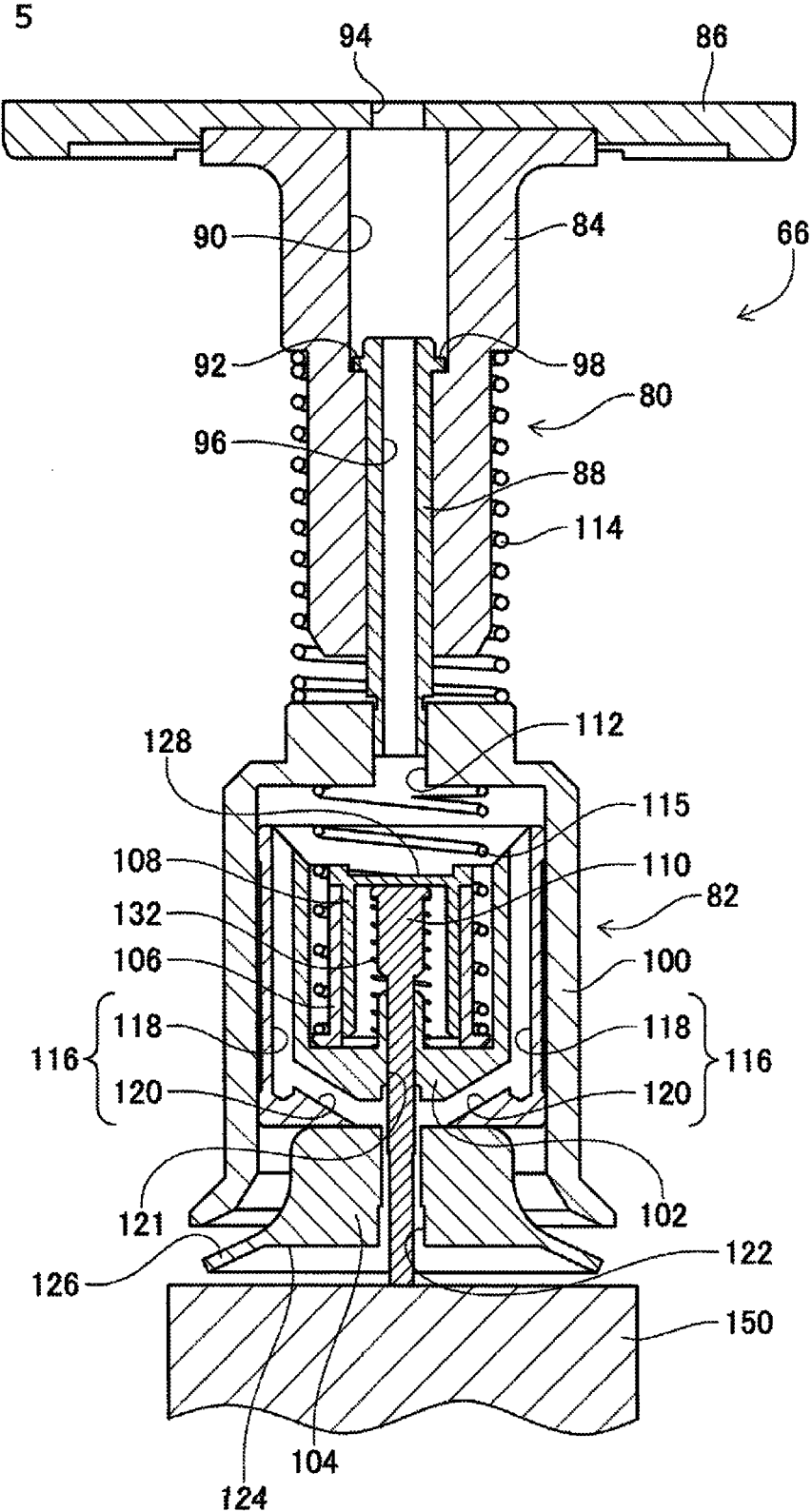
FIG. 5 is a cross-sectional view illustrating the suction nozzle in a state where the component is detached.

In addition, as illustrated in FIG. 5, the flow path forming member 102 moves downward and the suction pads 104 also move downward along with the flow path forming member 102 in the inside section of the support member 100 by the elastic force of the coil spring 115. Further, the rod pressing member 108 moves downward, and the rod 110 moves downward against the elastic force of the coil spring 132 along with the rod pressing member 108, by the air blown from the through-hole 112 of the support member 100. Accordingly, the lower end of the rod 110 further moves downward than the lower end of the outer edge section 126 of the suction pad 104, and is in contact with the component 150.

Accordingly, when positive pressure air is supplied to the suction nozzle, air is blown into the inside section of the recessed section 124 of the suction pad 104, the rod 110 descends, and the lower end of the rod 110 is in contact with the component 150. Accordingly, even when the component 150 is in close contact with the outer edge section 126 of the suction pad 104 and the component 150 is unlikely to be detached from the suction pad 104, the component 150 can be securely detached.

Incidentally, in the embodiment, the suction nozzle 66 is an example of a suction nozzle. The through-hole 90 is an example of an air flow path. The through-hole 94 is an example of an air flow path. The through-hole 96 is an example of an air flow path. The support member 100 is an example of a support member. The suction pad 104 is an example of a suction pad. The rod 110 is an example of a movable member. The through-hole 112 is an example of an air flow path. The air flow path 116 is an example of an air flow path. The through-hole 122 is an example of an air flow path. The recessed section 128 is an example of an air flow path.

The present disclosure is not limited to the embodiments described above, and can be implemented in various aspects in which various modifications and improvements are made based on knowledge of those skilled in the art. Specifically, for example, in the embodiment, the lower end of the support member 100 and the outer edge section 126 of the suction pad 104 are normally separated from each other, and when negative pressure air is supplied to the suction nozzle 66, the outer edge section 126 of the suction pad 104 is supported by the support member 100, but the outer edge section 126 of the suction pad 104 may be always supported by the support member 100, regardless of the supply of negative pressure air to the suction nozzle 66.

REFERENCE SIGNS LIST

66: suction nozzle, 90: through-hole (air flow path), 94: through-hole (air flow path), 96: through-hole (air flow path), 100: support member, 104: suction pad, 110: rod (movable member), 112: through-hole (air flow path), 116: air flow path, 122: through-hole (air flow path), 128: recessed section (air flow path)

The invention claimed is:

1. A suction nozzle which sucks and holds a component on a suction surface by using negative pressure air and detaches the sucked and held component from the suction surface by using positive pressure air, the suction nozzle comprising:
   a flow path forming member that includes a peripheral wall section and a bottom section;
   an air flow path through which the positive pressure air and the negative pressure air selectively flow, the air flow path formed in the peripheral wall section and the bottom section; and
   a movable member which is advanced and retracted toward the suction surface in an inside section of the suction nozzle, the movable member moving relative to the flow path forming member,
   wherein the movable member protrudes from the suction surface by the positive pressure air flowing through the air flow path and is retracted in the inside section of the suction nozzle when the negative pressure air flows through the air flow path, and
   wherein the flow path forming member is within a support member and slides relative to the support member.

2. The suction nozzle according to claim 1, further comprising:
   a suction pad which is made of elastically deformable material and includes the suction surface,
   wherein the support member supports an edge section of the suction surface which is elastically deformed from a side opposite to the suction surface at the time of sucking a component by the suction pad.

3. The suction nozzle according to claim 2,
   wherein the support member is relatively movable with respect to the suction pad so that the support member detaches from the suction pad when the positive pressure air flows through the air flow path and supports the edge section of the suction surface of the suction pad from a side opposite to the suction surface when the negative pressure air flows through the air flow path.

4. The suction nozzle according to claim 1, wherein the movable member includes
   a rod that slides in a through-hole of the flow path forming member, and
   a rod pressing member that presses the rod to protrude from the suction surface by the positive pressure.

5. The suction nozzle according to claim 1, wherein the flow path forming member is biased relative to the support member by a first spring and the movable member is biased relative to the flow path forming member by a second spring.

* * * * *